United States Patent [19]

Weimer

[11] 4,016,550
[45] Apr. 5, 1977

[54] CHARGE TRANSFER READOUT OF CHARGE INJECTION DEVICE ARRAYS

[75] Inventor: Paul Kessler Weimer, Princeton, N.J.

[73] Assignee: RCA Corporation, New York, N.Y.

[22] Filed: Nov. 24, 1975

[21] Appl. No.: 634,447

[52] U.S. Cl. .................. 340/173 R; 307/221 R; 357/24
[51] Int. Cl.² .................................... G11C 1/40
[58] Field of Search .............. 340/173 R, 173 RC; 307/221; 357/24

[56] References Cited
UNITED STATES PATENTS 3,763,480  10/1973  Weimer .................. 340/173 SM
3,889,245  6/1975  Gosney .................. 340/173 SM Primary Examiner—Terrell W. Fears
Attorney, Agent, or Firm—H. Christoffersen; Samuel Cohen

[57] ABSTRACT

The combination of an X-Y addressed array of charge injection devides (CIDs) and a charge transfer output register system. The array is read out a row at a time by first restoring charge to the columns of the array, then removing the excess charge from the columns to reset them to a reference potential, then causing the photo-induced charge carriers in a row to change the column potentials to extents dependent upon the photo-induced charge levels. This change in potential is employed to supply charge signals in parallel to the charge transfer stages of the output register system.

26 Claims, 18 Drawing Figures

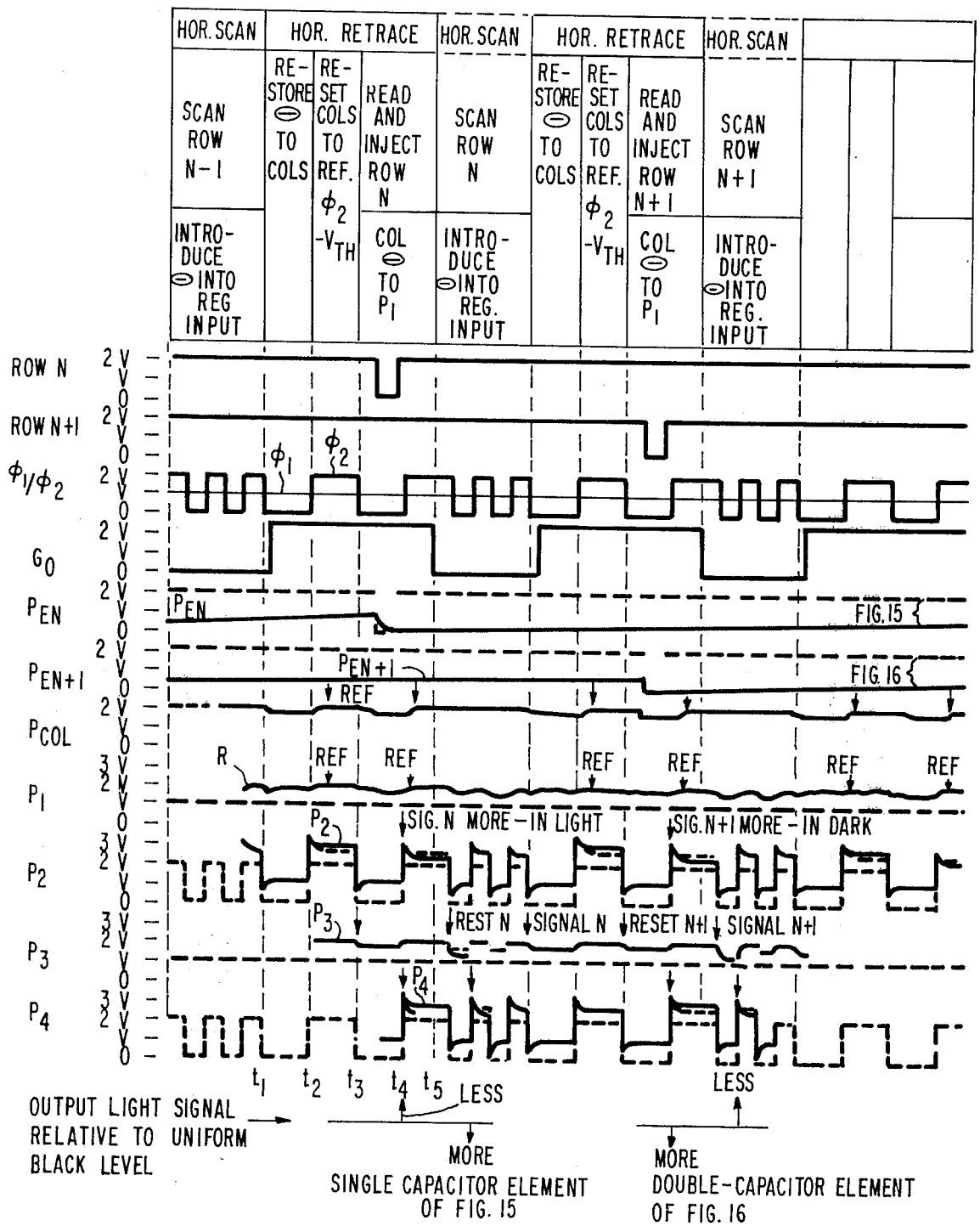

CHARGE TRANSFER READOUT OF CHARGE INJECTION DEVICE ARRAYS

The present invention relates generally to image sensing and more particularly to the readout of image sensing arrays such as those of the charge injection device type.

Charge transfer readout of image sensing arrays both of the internally scanned and the X-Y addressed type previously have been proposed and indeed internally scanned charge transfer arrays of the charge coupled device (CCD) type operated in this way are commercially available. In these systems, the charge packets produced in the array in response to photon excitation are transferred to a charge transfer output register and then read from the output register in serial fashion in response to the application of multiple phase shift pulses. Some advantages of this form of readout are its favorable noise characteristics, its ability to operate at relatively high speed, its uniformity of signals from one element to the next, its compatibility with the elements of the array, and its ease of fabrication in integrated circuit form. However, charge injection device (CID) image sensing arrays present particular problems when attempted to be read out in this way. One is that the charge packets produced in the CID sensor elements cannot themselves be conveniently transferred to the output register. Rather, they either remain stored at each location or, when erasure is desired, they are "injected" into the substrate where they recombine with carriers of the opposite type. In addition, the capacitance of the CIDs is relatively small compared to the capacitance of the column conductors of the array so that the output signals induced on the column conductors are relatively small. This means that small variations in the voltage on the column conductors due, for example, to variations in parameters among the readout circuits for the different columns can substantially reduce the intelligibility of the output signals.

In arrays embodying the present invention, charge transfer readout is employed for CID image sensing arrays. The photon induce charge signals present in a row of the array are employed to change the potential of the column conductors to extents proportional to the charge signal levels, after the column conductors have been reset to a reference level. The column conductors are then employed to control the amounts of charge supplied to stages of the output charge transfer register. In preferred forms of the invention, the effect on the amplitude of the output signals read from the CID array of the possibly different threshold levels ($V_{TH}$) of the transistors employed for readout is eliminated by resetting the column conductors to the reference potential via the conduction paths of the same transistors employed to obtain the output signals from the array.

In the drawing, in which like reference characters are employed to identify similar elements:

FIG. 18 is a drawing of waveforms to help explain the operation of the system of FIGS. 15 – 17.

Figure 1:
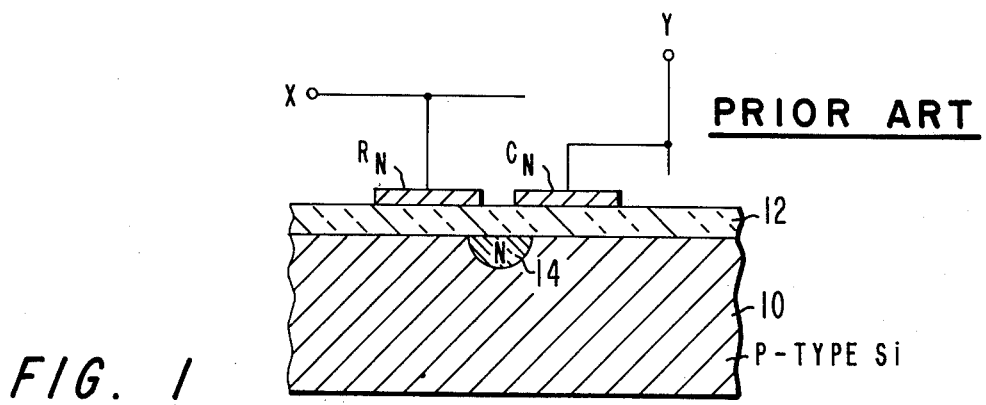
FIG. 1 is a cross-section through a known charge injection device.

The known CID of FIG. 1 includes a semiconductor substrate 10, an insulating layer 12, such as one formed of silicon dioxide ($SiO_2$) and two capacitor plates or conductors $R_N$ and $C_N$ over the insulating layer 12. When in an array, the two plates may be connected to the row (X) and column (Y) conductors, respectively of the array. A small region 14 of opposite conductivity type to the substrate may be located at the substrate surface between the two plates $R_N$ and $C_N$, the edges of the plates preferably overlapping the region 14. Region 14, for example, may be a diffusion in the substrate. However, the diffused region 14 may be omitted if the two plates $R_N$ and $C_N$ are allowed to overlap.

In the operation of the CID of FIG. 1, if a plate such as $R_N$ is maintained at a positive potential and light or other radiation to which the substrate is sensitive is projected onto the substrate, electron-hole pairs will be created. The radiation may be projected through the back surface of the substrate, assuming it to be suitably thinned, or through the plate $R_N$, assuming it to be transparent or relatively so, or through regions of the $SiO_2$ close to the plate $R_N$. The positive potential applied to plate $R_N$ causes a depletion region to form in the substrate beneath this plate and the minority carriers (electrons in the case of a P type substrate) accumulate in at the surface of this depletion region, If, after electrons are present beneath plate $R_N$, X is made relatively negative (for example is returned to ground level) and Y is made relatively positive, the electrons will be repelled from the region of the substrate beneath plate $R_N$, they will pass through the conducting region created by the N type region 14, and will accumulate at the surface of the region of the substrate beneath plate $C_N$. The process can be reversed by making $R_N$ relatively positive and $C_N$ relatively negative. If desired, charges may be accumulated beneath both plates $R_N$ and $C_N$ if X and Y are both kept relatively positive.

The CID may be erased by making both X and Y relatively negative. In response thereto, the minority carriers accumulated beneath these plates are "injected" into the substrate where they recombine with holes.

Figure 2:
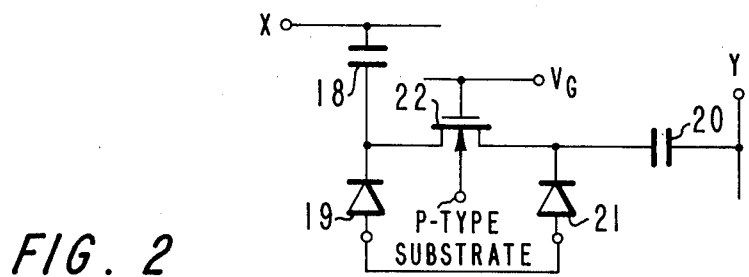
FIG. 2 is a schematic diagram of a circuit which may be employed to simulate the performance of the circuit of FIG. 1.

The operation of the circuit of FIG. 2 is analogous to that of FIG. 1. Capacitor 18 simulates the operation of the capacitance between the plate $R_N$ and the substrate 10, and capacitance 20 simulates the operation of the capacitance between the plate $C_N$ and the substrate. Illumination of the transistor or of separate photodiodes shown at 19 and 21 cause charges to accumulate in exactly the same way as described in FIG. 1. Charge transfer may be effected by maintaining a slightly positive voltage $V_G$ at the gate electrode of N channel transistor 22 while applying appropriate voltage levels to the X and Y conductors. For example, if X is made relatively negative and Y is made relatively positive when transistor 22 is on, charge will flow from the capacitor 18 to capacitor 20.

Figure 3:
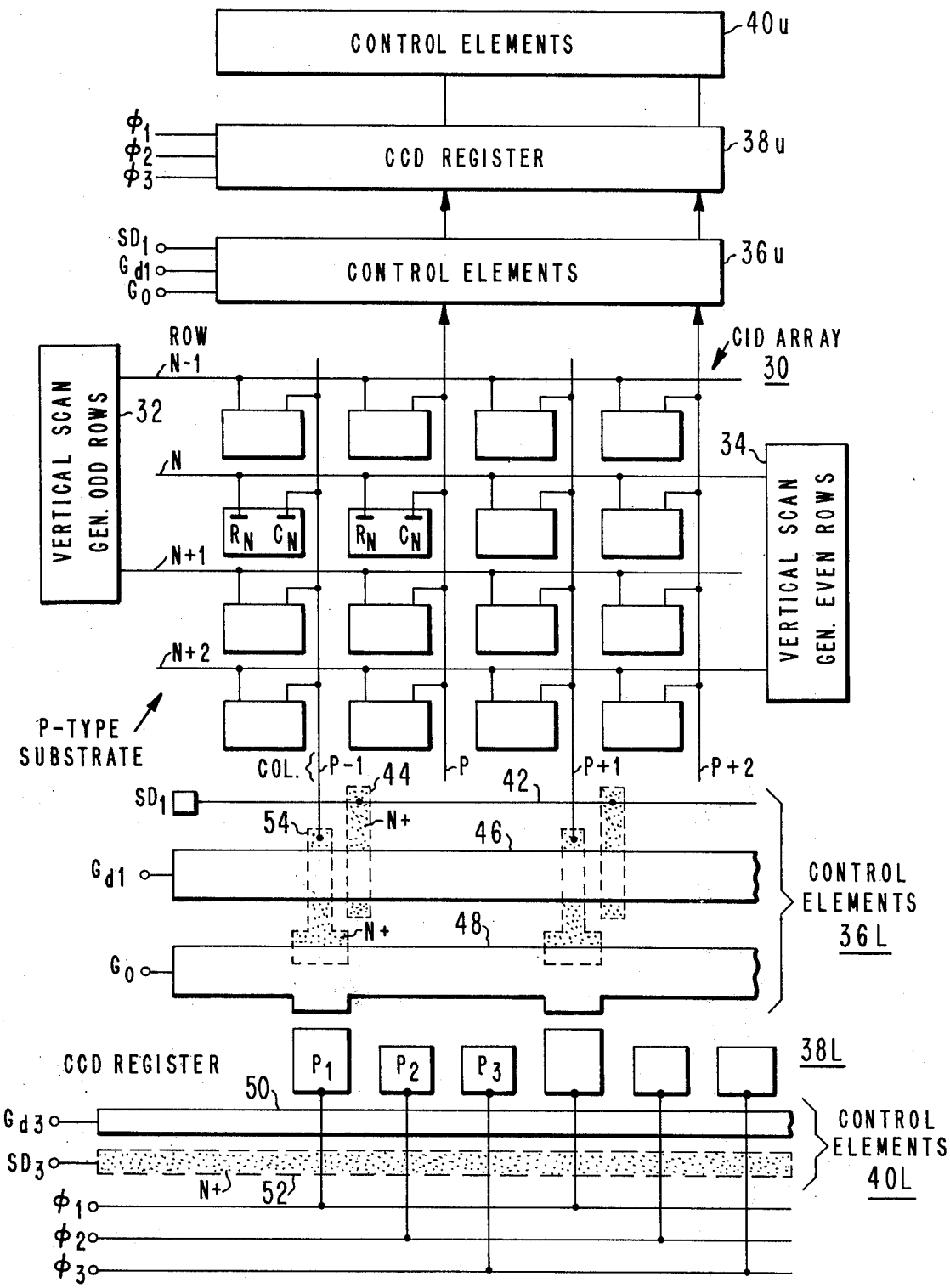
FIG. 3 is a schematic showing of a CID imaging array employing charge transfer readout embodying one form of the invention.

The system of FIG. 3 includes a CID array 30 with four columns P−1, P, P + 1 and P + 2 and four rows N−1, N, N + 1 and N + 2 but which, in practice, may be substantially larger than this. The odd numbered rows N−1 and N + 1 are scanned by vertical scan generator 32 and the even numbered rows N and N + 2 by vertical scan generator 34. The odd numbered columns P−1 and P + 1 are connected via control elements 36L to a charge transfer register 38L of the CCD type and to control elements 40L. The even numbered columns P and P + 2 are similarly connected via control elements 36U to CCD register 38U and other control elements 40U. The upper and lower like numbered parts are identical, L designating lower and U upper.

For purposes of the present invention explanation, P type substrates are assumed throughout but it is of course to be appreciated that the invention is equally applicable to systems employing N type substrates or to substrates having an epitaxial layer of opposite conductivity type underlying the oxide and electrons structure. Also, elements such as channel stops and details of electrode and other structures which in themselves are now well known in the art are assumed to be present and not specifically illustrated.

The control elements 36L include a conductor 42 which connects to a diffused N+ conductor 44 in the P type substrate assumed, and which receives a control device $SD_1$. The following conductor 46 is insulated from the substrate and operates as a gate electrode in a manner to be discussed shortly. It receives a control voltage $Gd_1$. The next conductor 48 also is a control electrode and it is insulated from the substrate. Electrode 48 is operated by control voltage $G_O$.

The CCD register 38L shown by way of illustration is a three phase register. Each stage includes three electrodes $P_1$, $P_2$, $P_3$ and these electrodes are receptive of the three phase voltages $\phi_1$, $\phi_2$, $\phi_3$, respectively.

The control elements 40L include a gate electrode 50 which is insulated from the substrate and which is operated by a control voltage $Gd_3$. The final element is an N+ diffusion 52 in the substrate which is operated by a control voltage $SD_3$.

Figure 4:
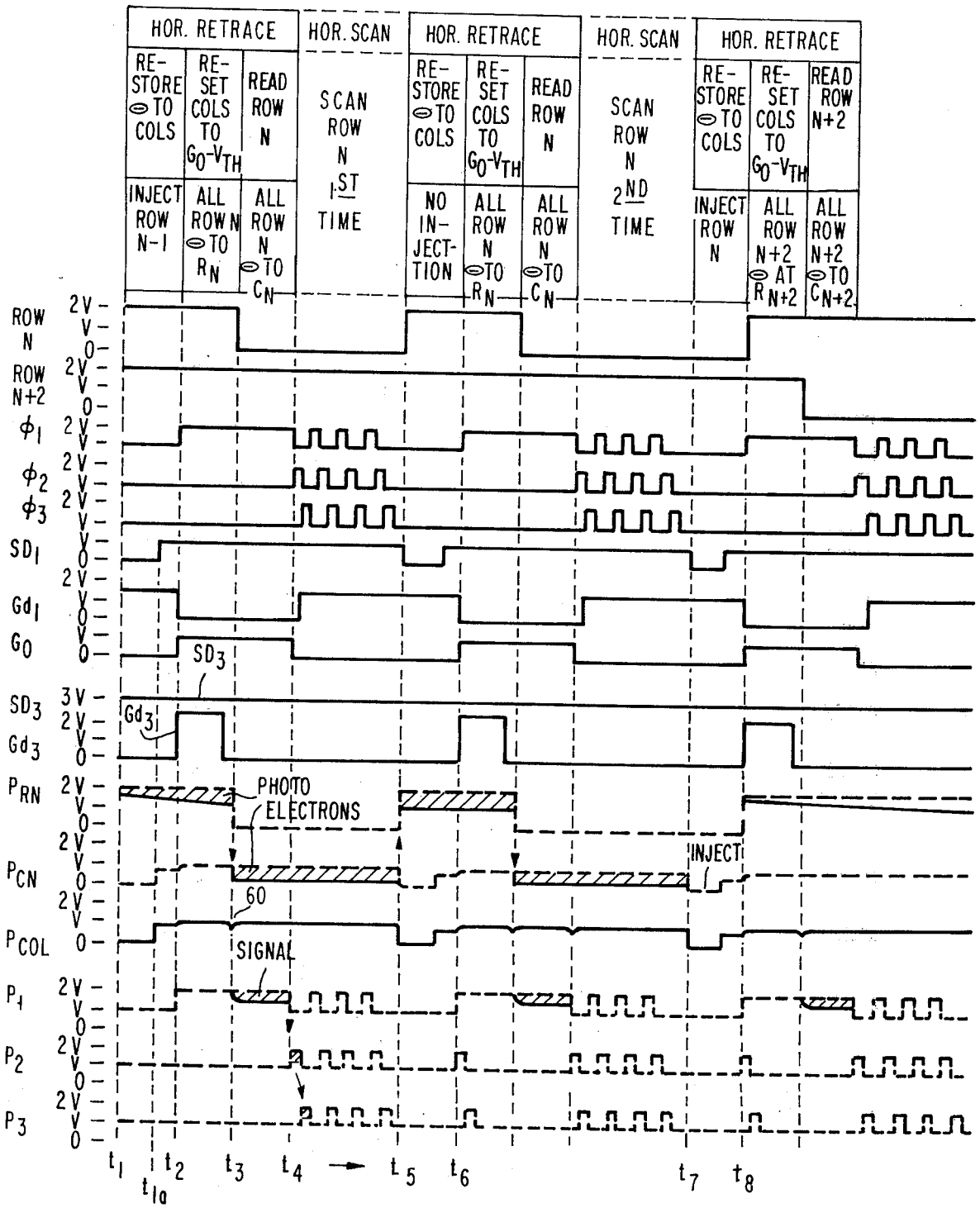
FIG. 4 illustrates various waveforms for the system of FIG. 3.

In the discussion of the operation of the system of FIG. 3 which follows, both FIGS. 3 and 4 should be referred to. In FIG. 4 and following drawings of waveforms, P followed by a subscript generally refers to an induced potential, for example as at a substrate surface. Sometimes the same characters are used to identify the potential as are used to identify the circuit element. For example, $P_1$ in FIG. 4 refers to the surface potential beneath electrode $P_1$. Letters such as Gd or $SD_1$ generally refer to applied voltages.

During the integration time, that is, during the time charge carriers are permitted to accumulate at the respective CID elements of the array in response to an image projected onto the array, the rows of the array are maintained at relatively positive potentials. In FIG. 4, this positive potential is indicated as +2V, where V may be some voltage such as 5 volts, as one example. (The actual value employed, of course, will depend upon the particular design of the array.) To read out the array, first the columns are reset to a reference potential in a manner discussed shortly, and then the row being read is switched from the voltage +2V to a more negative (actually a less positive) value such as 0 volts. The result is a transfer of charge from beneath capacitor plates $R_N$ to beneath plates $C_N$ in the row being read. In response thereto, signal is supplied from the columns to the CCD register electrodes $P_1$, as will be discussed shortly.

The first step in preparation for readout is to "restore" electrons to the columns, as indicated by the legend in FIG. 4 at the top of the chart, time $t_1 - t_2$. This occurs during the horizontal retrace time of television. The row to be read is row N. This row is initially at a voltage +2V. In the discussion which follows, only one element in row N, namely the one in column P−1, will be referred to. It is to be understood that exactly the same thing is occurring at all other elements in the row. Similarly, in the discussion of the CCD register, only one stage will be referred to, it being understood that the same conditions exist at the other stages.

At time $t_1$, $SD_1$ goes low, that is, it changes from a value somewhat less than +V voltage to 0 volts. $Gd_1$ is high at this time, that is, it is a value somewhat greater than +V volts. Thus, the transistor (N-channel) formed by N+ diffusion 44, gate electrode 46, and the diffusion 54 at the end of the column conductor P−1, goes on. As $SD_1$ is relatively negative, diffusion 44 acts as a source electrode, that is, it acts as a source of electrons. These electrons pass through the transistor and flow to the column conductor P−1. As a result, the column conductor potential ($P_{COL}$) changes in value from +V to the potential of source 44, which is zero volts.

Next, at time $t_{1a}$, $SD_1$ goes high, that is, it changes in value from 0 volts to a value slightly under +V volts. Control voltage $GD_1$ still is at +V. Accordingly, transistor 44, 46, 54 still is on but now region 54 acts as the source and 44 as the drain and electrons flow through this transistor in the opposite direction. The result is to reset the column conductor P−1 to a potential close to that of diffusion 44.

If desired, the above could be the final resetting step for resetting the column conductors to the reference potential (somewhat less than +V in this example). This would work perfectly well if one could be certain that all of the transistors corresponding to 44, 46, 54 had the same voltage threshold ($V_{TH}$). If they did, all of the columns would be at precisely the same potential. However, in practice, at the present state of the art it is difficult to fabricate transistors which all have the same $V_{TH}$. In a large array with many (over a hundred in many cases) transistors such as 44, 46, 54 one could say with a fair degree of certainty that the $V_{TH}$'s will be different. If the voltage thresholds of the transistors are not the same, then the columns cannot be reset to the same potential and this adversely affects the operation of the system in that the output signals of the array are not true indications of the charges collected at the CID array elements.

The problem above is avoided in the system of FIG. 3 in the following way. After the initial "restore" step described above there is a "reset" step which occurs during time $t_2$-$t_3$. During reset, $Gd_1$ changes from +V to 0 cutting off transistor 44, 46, 54. At the same time, $G_O$ goes high from 0 to +V, $Gd_3$ goes high from 0 to a value somewhat over 2V and $\phi_1$ goes high from +V to +2V. At the same time, $SD_3$ remains at a relatively high level of +3V. In response to these various levels, conduction occurs from diffusion 54 through the conduction paths beneath electrodes 48, $P_1$ and 50 to the drain diffusion 52. In the process, the column conductor becomes slightly more positive and attains a voltage level $G_O$-$V_{TH}$, where $G_O$ is equal to +V and $V_{TH}$ is the voltage threshold of the transistor 54, 48, $P_1$, 50, 52. Just prior to time $t_3$, $Gd_3$ returns to 0 volts as shown in FIG. 4, to again isolate the CCD register from drain diffusion 52. When the column conductor reaches this potential, current stops flowing through transistor 54 . . . 52.

Now the voltage $G_O$=V is the same for every column. However, the voltage $V_{TH}$ is not, as all of the transistors corresponding to 54, 48, $P_1$ do not have the same value of $V_{TH}$. Accordingly, the columns are not all at the same potential. However, the effects of the different $V_{TH}$'s can be compensated for, and the system can still be made to operate properly. This compensation is achieved in the present system by reading out the columns through the same transistors as employed to set the columns to the reference level, as discussed shortly.

One further aspect of the present system is that the CCD registers are emptied during the same process employed to reset the columns. Any excess electrons which may be present beneath electrode $P_1$ will be swept out to the drain diffusion 52 during the reset process. By emptying the register stage completely during the reset process one can be certain that no remnant charge remains which might be different from one stage to the next causing a non-uniform output signal. As will be explained next, a background charge can be added to each stage of the register during the "read" interval ($t_3$-$t_4$) by increasing the voltage $G_O$ slightly at this time. In a surface channel CCD, it is desired to have such charges present to compensate for the effect of fast trapping states at the substrate surface. Such charge signals are known colloquially as "fat zero" charge signals.

The next step in the read out process is legended "read row N" and it occurs in the time period $t_3$-$t_4$. Row N is read by changing the voltage level on the row from +2V to 0. In response thereto, the photoelectrons (the minority carrier charge signals) located under electrode $R_N$ pass to beneath electrode $C_N$. It should be recalled that at this time column P–1 is at $G_O$-$V_T$ volts (approximately +V volts) so that as the row N goes to 0 volts the charge transfer takes place. The transfer of charge signals is manifested as a slight negative dip, shown at 60 in FIG. 4, in the column potential. It should be pointed out here that the capacitance of a column is much greater than the capacitance of a CID element and therefore there is capacitive voltage division in translating the change in voltage across capacitance $C_N$ to a corresponding change in the voltage of the column. It is for this reason that the reference voltage level on the column must be very accurately established.

In response to the electrons included on the column conductor when electrons are transferred to capacitor $C_N$, manifested in FIG. 4 by the slight negative dip at 60, transistor 54, 48, $P_1$ turns on. Note that in this period, $G_O$ has not changed — it is still a +V and that $\phi_1$ is still at +2V. (As noted above $G_O$ can be increased very slightly at $t=t_3$ if an additional background charge is to be added to the signal at each stage of the register.) The $\phi_1$ gate electrode voltage creates a depletion region beneath the electrode $P_1$ and this depletion region operates as the drain electrode of an N channel transistor, diffusion 54 operating as the source electrode of the transistor Gate electrode 50, as already mentioned, is at 0 volts at time $t_3$, when signal shown at 60 is produced (see FIG. 4) thereby providing a potential barrier between this depletion region and drain 52. When this transistor goes on, the electrons induced in the column conductors pass from diffusion 54 to the depletion region beneath electrode $P_1$ of the CCD register. Note that the readout transistor is the same as the reset transistor 54, $G_O$ $P_1$, with 54 acting as the source electrode. Therefore, the threshold $V_{TH}$ of the output transistor is precisely the same as the $V_{TH}$ of the same transistor employed to reset the column. Accordingly, the effect of this threshold voltage cancels and the amount of charge transferred beneath plate $P_1$ is very precisely a function of V and the charge which is transferred to beneath electrode $C_N$. As V is identical in each column, the charge transferred to each stage of the CCD is, in each case, directly proportional only to the signal charge present in the corresponding CID.

After the parallel transfer of a row information as discussed above, one half of the row being transferred to the CCD register 38L and the other half of the row being transferred in precisely the same way to the CCD register 38U, the readout of the CCD registers 38L and 38U takes place. The readout occurs during the horizontal scan time $t_4$ – $t_5$, shown only in part in FIG. 4. The readout occurs in response to the multiple phase voltages in the manner illustrated schematically in FIG. 4. To transfer charge to beneath $P_2$, $\phi_2$ is made positive and $\phi_1$ is made less positive, and so on. During readout, the contents of CCD register 38L is serially combined in interleaved fashion with that of CCD register 38U to reconstitute the row of video information. A number of structures for combining the contents of a plurality of registers in this way are illustrated in copending application Ser. No. 524,829 filed Nov. 18, 1974 by Walter F. Kosonocky, for Charge Coupled Device Imager and assigned to the same assignee as the present application.

While for purposes of the present illustration, the vertical scan generators are shown in two parts as are the control elements and CCD registers, it is to be appreciated that this need not be the case. Making these portions of the system in two parts is simply for the purpose of permitting the column and row conductors to be placed closer to one another. If there were only one set of elements 36, 38, 40 for the entire array, the columns could be no closer to another than the width of one stage of the CCD register (the width of three electrodes in this example). In the arrangement, as shown, the columns can be placed apart a distance equal to one-half the width a CCD register stage. The same reasoning applies to the vertical scan generators. The use of two separator scan generators is particularly appropriate for scanning in a vertically interlaced television system, where the scan generators operate alternately in successive fields.

The system of FIG. 3 may be operated in non-destructive fashion. Such non-destructive readout for row N is concluded during the time period $t_5 - t_6$ of FIG. 4. Row N is placed at a voltage +2V during this period. Concurrently, the columns are driven relatively negative to 0 volts. The result is the non-destructive transfer of electrons beneath plates $C_N$ to beneath plates $R_N$ of row N. This permits the same row N to be read out again during, for example, the following horizontal scan period, as illustrated, and/or during additional later horizontal scan periods. Of course, the amount of the time the charge can be stored in a CID is limited-from a few seconds at room temperature to several hours at −70° C. Thus, the number of non-destructive reads possible of a row will be limited in corresponding fashion.

The information in row N may be erased in the manner illustrated in the time period $t_7 - t_8$ of FIG. 4. Erasure involves making row N relatively negative (driving it to ground level) during the "restore" time interval. This occurs concurrently with the driving of the column conductors to a relatively negative (ground) level. The result is the injection of the charge carriers (electrons) stored at all CID elements of row N, back into the substrate where they recombine with holes. Thereafter, the row may again begin to integrate charge by making row N positive (raising the potential to +2V). The integration will continue until the next time row N is erased. In general, each integration of charge by a row which has been read out, then erased, then returned to +2V continues for the duration of one field time (1/30 second in commercial television), when the process will be repeated for that row.

Figure 5:
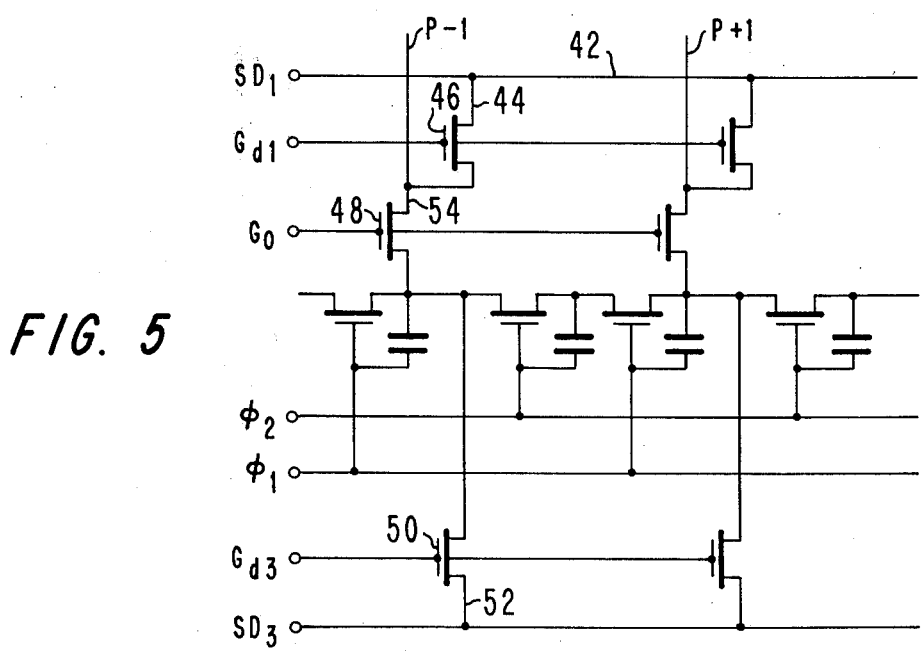
FIG. 5 is a schematic drawing of an alternative form of a portion of the system of FIG. 3.

In the system of FIG. 3, the charge transfer output register system employed is one of the CCD type. As an alternative, bucket brigade output registers may be used instead. A portion of such a register is shown in FIG. 5. Corresponding elements in the two figures are identified by similar reference characters. The analogy between the bucket brigade and the CCD modes of operation is sufficiently well understood that detailed discussion of FIG. 5 is not required.

Figure 6:
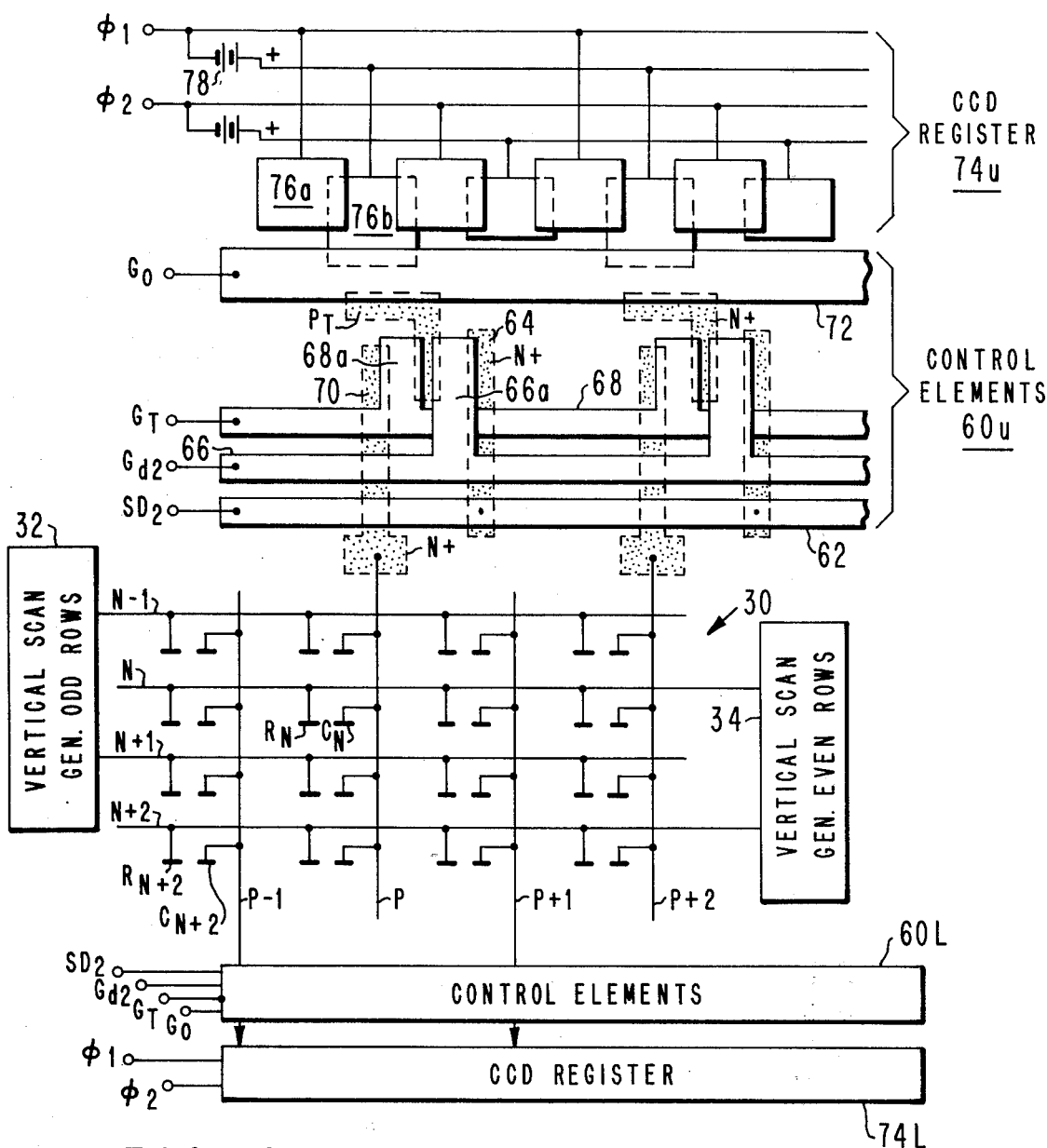
FIG. 6 is a schematic showing of a second embodiment of the present invention.

The embodiment of the invention shown in FIG. 6 operates on the same principle as the array of FIG. 3 but includes simpler control elements 60. The latter comprise a conductor 62 which is operated by control voltage $SD_2$. This conductor 62 connects to N+ diffused regions 64 in the substrate. The following element 66 is a conductor which is insulated from the substrate and is driven by control voltage $Gd_2$. Electrode 66 is formed wih extensions 66a which operate as gate electrodes. The conduction path controlled by a gate electrode 66a is betweem the diffusion 64 and a second diffusion $P_T$, the latter comprising an electrically floating region.

The following electrode 68 also is insulated from the substrate and is formed with fingers 68a. These fingers operate as gate electrodes. The conduction path controlled by a finger 68a lies between the floating diffusion $P_T$ and a diffusion 70 which connects to a column conductor such as P. The final control element is gate electrode 72 which is insulated from the substrate and is driven by control voltage $G_O$.

CCD register 74 is shown as a two phase register. Here and elsewhere any one of a number of different types of CCD or bucket brigade registers may be employed, the particular one illustrated being an example only. Each stage of register 74 comprises four electrodes arranged in pairs of two electrodes each. A pair of electrodes such as 76a, 76b is operated by the same voltage phase, $\phi_1$ in this example. However, the DC levels applied to each electrode of the pair are offset relative to one another, the level applied to the electrode 76b which is closer to the substrate being more positive than the voltage level applied to the other electrode 76a of the pair. The voltage offset is indicated schematically by battery 78.

Figure 8:
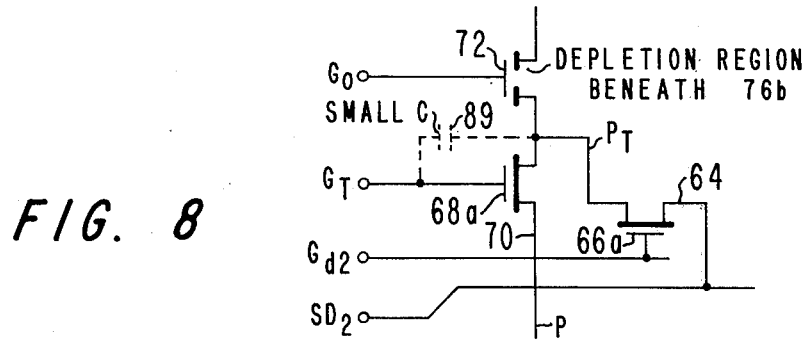
FIG. 8 is a schematic drawing of a portion of the system of FIG. 6.
Figure 7:
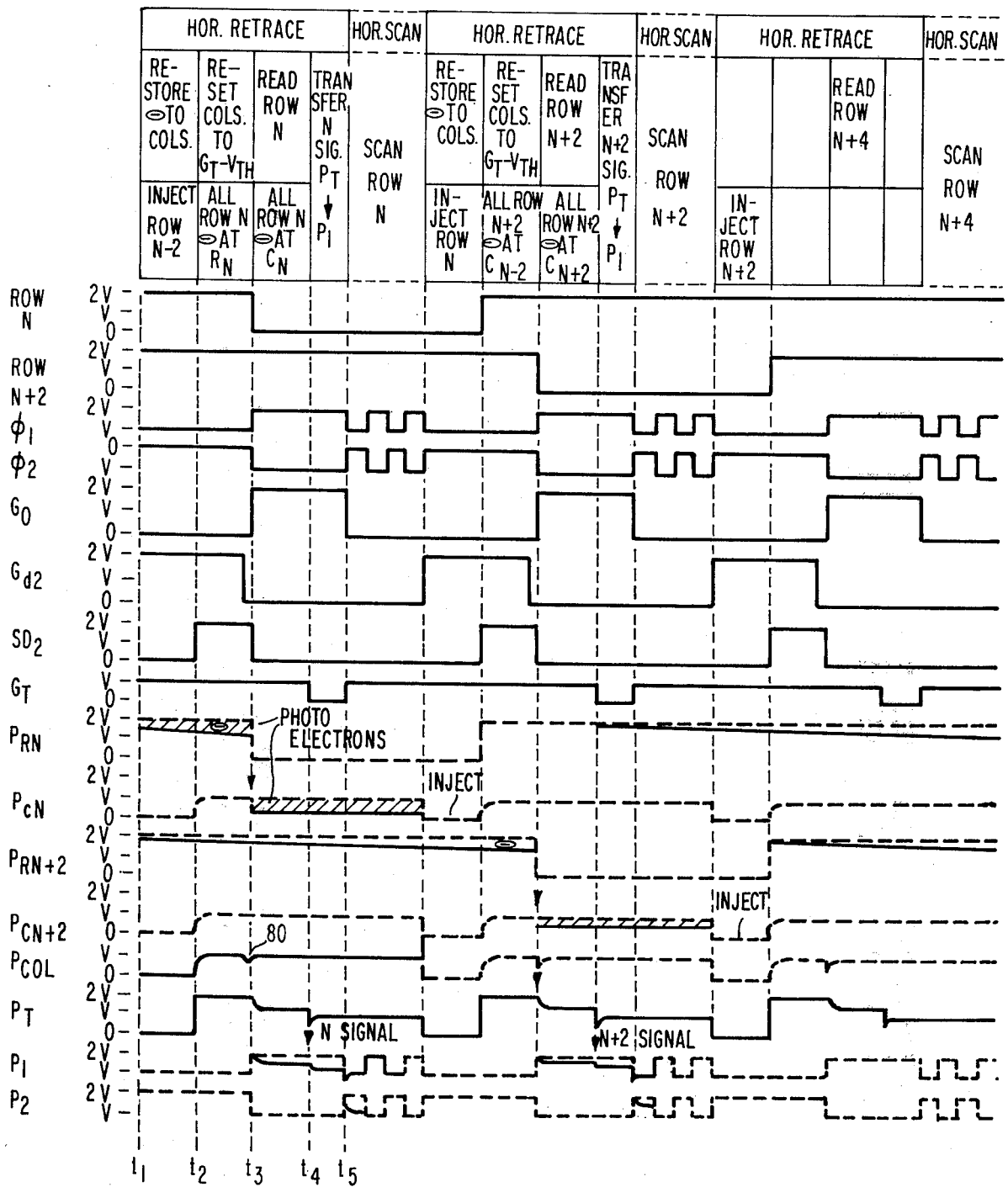
FIG. 7 is a drawing of waveforms for the system of FIG. 6.

The operation of this system of FIG. 6 is illustrated in FIG. 7. FIG. 8 which shows the control elements 60 in circuit diagram form may also be referred to. In operation, prior to reading signals from a row, the row is first restored and then reset. The restore operation is for the purpose of placing excess electrons in the columns and is illustrated for the time period $t_1 - t_2$. During this period, $SD_2$ is at ground level so that diffusion 64 is also at this level and acts as a source of electrons. $Gd_2$ is at +2V so that the gate electrode 66a of the transistor turns on the transistor. Accordingly, electrons flow from source 64 through the conduction path of the transistor to the floating diffusion $P_T$. At the same time, $G_T$ is high at +V volts so that conduction occurs through the transistor $P_T$ 68a, 70, with $P_T$ acting as the source electrode, 68a as the gate electrode and 70 as the drain electrode. Thus, electrons flow to the columns as, for example, P and the columns assume a potential close to 0 volts.

The reset period $t_2 - t_3$ occurs next. In order to reset, control voltage $SD_2$ goes high to +2V while $Gd_2$ remains high at +2V. This causes diffusion 64 to act as a drain for electrons and these electrons flow from floating diffusion $P_T$ to the drain 64. $G_T$ remains high at +V volts. Accordingly, excess electrons flow out of the columns from diffusion 70 acting as a source electrode through the conduction path beneath gate electrode 68a to the floating diffusion $P_T$ and from there to the drain diffusion 64. The electron flow continues until the columns assume a potential $G_T - V_{TH}$, where $V_{TH}$ is the voltage threshold of transistor 70, 68a, $P_T$. This transistor then turns off. Finally, just prior to time $t_3$, The control voltage $Gd_2$ goes relatively negative to ground turning off transistor $P_T$ 66a, 64, and leaving the node $P_T$ at the potential 2V, which is very close to the potential assumed by the register under condition of zero input signal.

Next the row of interest, row N in this example, may be read. This occurs really during the entire period. $t_3 - t_5$; however, the first portion of this period $t_3 - t_4$ will be discussed first. During the second portion of the period the electrons read from the columns are transferred from the floating diffusions $P_T$ to the CCD register.

At time $t_3$, the row voltage supplied to row N by the vertical scan generator 34 is changed from +2V to 0. This causes the electrons stored beneath plate $R_N$ to transfer to beneath plate $C_N$. The information signal electrons thereby induced on the column conductors is manifested as a small drop in potential of the column conductor as indicated at 80 in FIG. 7. These signal electrons turn on transistor 70, 68a, $P_T$ and they flow through the conduction path of this transistor to the floating diffusion $P_T$ resulting in a reduction of its potential by an amount corresponding to the signal amplitude. Control voltage $G_O$ is relatively high at this time that is it is at +2V volts so that some of these electrons transfer through the conduction path beneath electrode 72 to the region of the substrate beneath electrode 76b, the latter being at a potential +2V at this time. The change in surface potential beneath electrode 76b is shown at $P_1$ in FIG. 7. $GD_2$ is still low at this time so that transistor 64, 66a, $P_T$ remains cut off.

During the next period $t_4$ to $t_5$, $G_T$ goes +V to 0 volts. This turns off transistors 70, 68a, $P_T$. At the same time, the signal electrons still present in the floating diffusion $P_T$ (and stored in the small capacitor 89 shown in FIG. 8) are repelled by the relatively negative voltage appearing on the gate electrode 68a and are caused to travel through the conduction path beneath electrode 72 to the depletion region beneath CCD electrode 76b. The arrival of these additional electrons beneath electrode 76b is indicated by the legend "N signal" in FIG. 7. The transistor under electrode 72 is then turned off by lowering the potential $G_O$ from +2V to near 0 thus isolating the CCD register from the input circuit.

After the process described above, the signals transferred to the CCD registers 74U and 74L are read out in serial fashion in response to the two-phase shift voltages $\phi_1$ and $\phi_2$ respectively, and combined at a common output structure, not shown, in interleaved fashion. The readout is indicated schematically in FIG. 7 by showing only two of the periods of the $\phi_1$, $\phi_2$ voltages.

The remainder of the operation is believed to be clear from what has been discussed already. The erasure of a row is accomplished in the same way as described in connection with FIG. 3 and is illustrated in FIG. 7 Erasure involves placing the row at ground level during a period corresponding to $t_1 - t_2$ when the column conductors are at ground level.

The circuit of FIG. 6 has the same voltage threshold $V_{TH}$ compensation feature as the circuit of FIG. 3. The transistor 70, 68a, $P_T$ is employed to reset the columns to the reference potential as well as to read the output signals from the columns so that the $V_{TH}$ of these transistors cancel at the various columns.

In the operation of the system of FIG. 3, during each reset period the discharge transistor (controlled by voltage $G_O$) operates in the source follower mode and the charge it passes must be removed from the CCD register prior to the read operation. This charge removal has to be properly done to avoid leaving a variable residual charge in the register which could contribute to non-uniformity in the information later stored in the register. In the FIG. 3 embodiment, the drain tap occurs at a CCD node (the depletion region beneath electrode $P_1$) which offers a significant advantage. It permits the CCD stage to be completely emptied to a potential level which is independent of the threshold voltage of the gate electrode (50 which is controlled by $Gd_3$) through which it is emptied.

Figure 9:
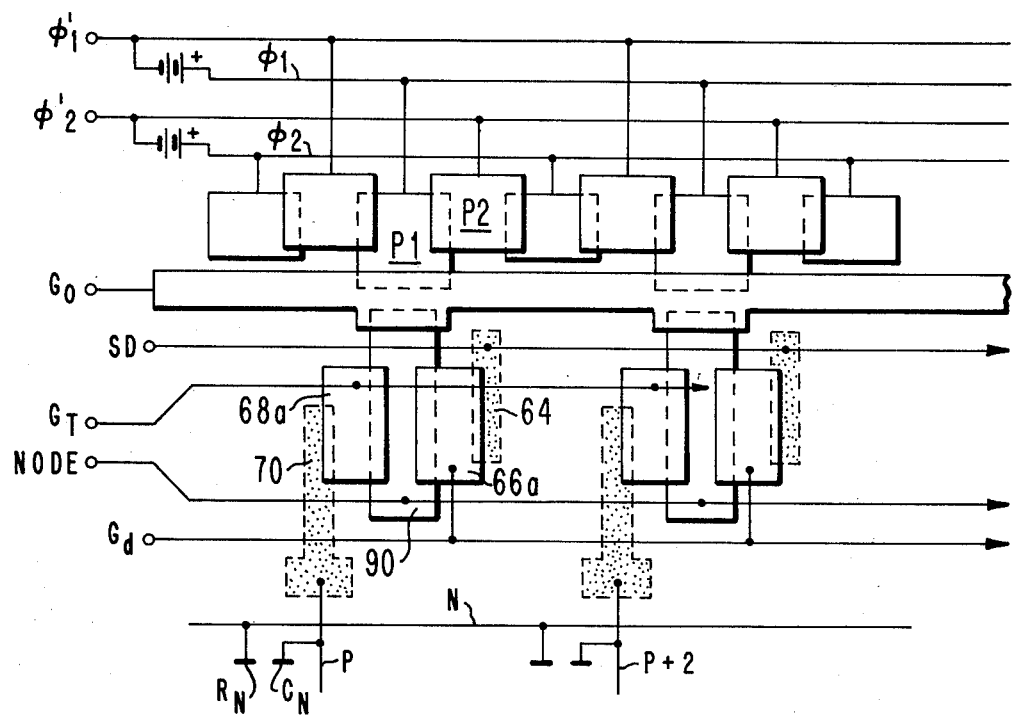
FIG. 9 is a schematic showing of another embodiment of the invention.
Figure 10:
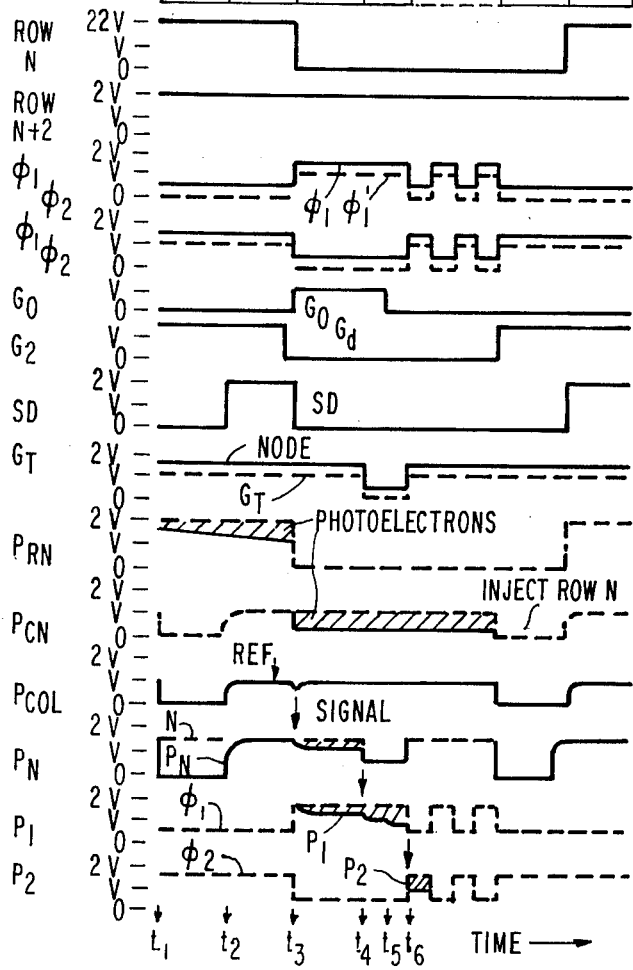
FIG. 10 is a drawing of waveforms to help explain the operation of the system of FIG. 9.

If the drain tap rather than being at a CCD element is instead at a diffused electrode as in the case of the system of FIG. 6 where the drain tap is at $P_T$, the capacitance of this drain tap, shown in phantom at 89 in FIG. 8, should be kept small to minimize the residual non-uniformity which might arise due to variation in the threshold voltage of the transistor under the gate 72. This possible source for non-uniformity is avoided in the system of FIG. 9 where the diffused node $P_T$ of FIG. 6 has been replaced with a CCD node (that present at the depletion region beneath CCD electrode 90) for improved uniformity. The operation of the system of FIG. 6 is in other respects quite analogous to that of FIG. 6 and is illustrated in the waveforms of FIG. 10.

Figure 11:
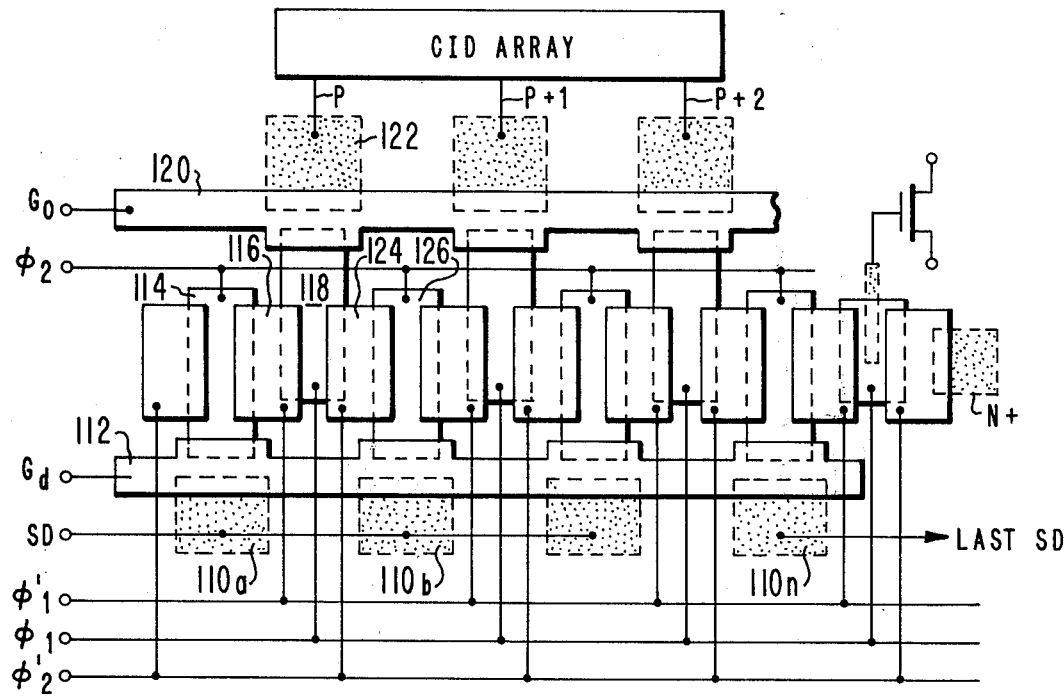
FIG. 11 is a schematic showing of another form of the invention.

The system of FIG. 11 employs only $\phi + 1$ diffusions (110) for an array with $\phi$ columns rather than $2\phi$ diffusions ($P_T$ and 64 per column) of the system of FIG. 6.

Figure 12:
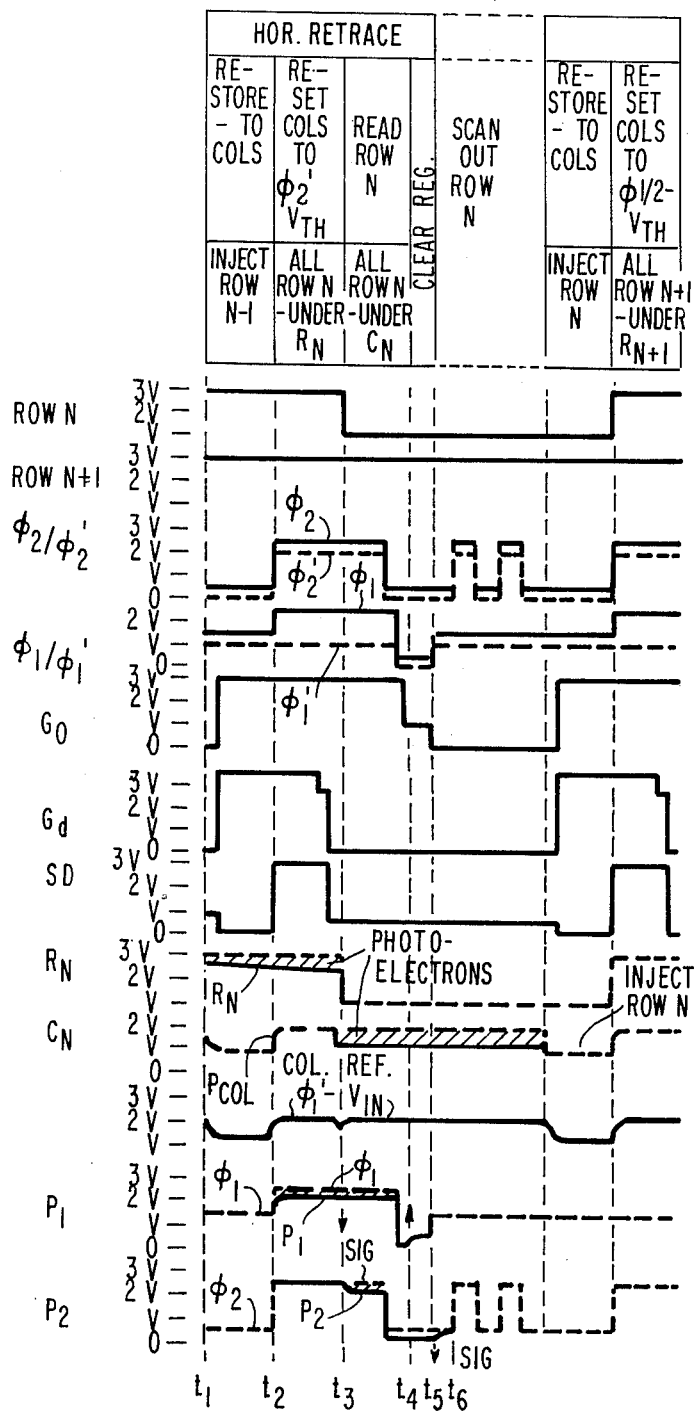
FIG. 12 is a drawing of waveforms to help explain the operation of the system of FIG. 11.
Figure 13:
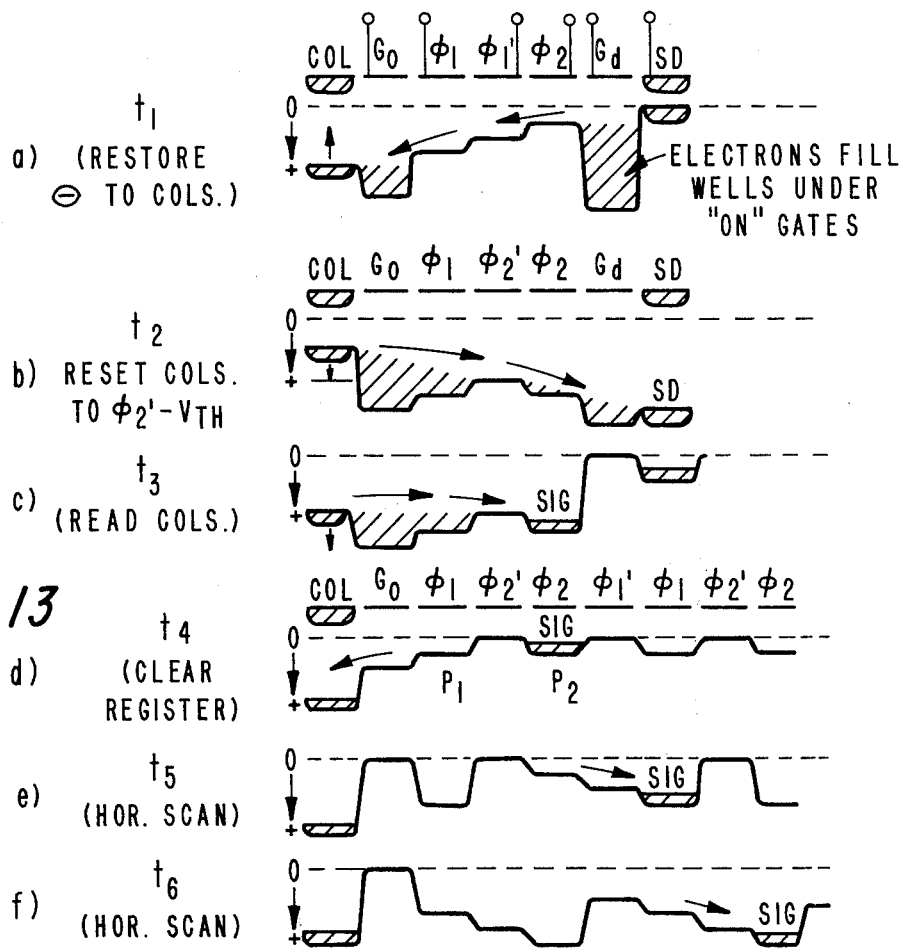
FIG. 13 is a drawing of surface potential profiles to further explain the operation of the system of FIG. 11.

The principle of operation of the system of FIG. 11 is similar to that of the previous figures and is illustrated in the waveform diagram of FIG. 12 and the surface potential profile diagram of FIG. 13. During the "restore" period SD is low (at ground) and acts as a source of electrons. $G_D$ is high (+3V) causing a conduction path to be present beneath gate electrode 112. The $\phi_2$, $\phi_1'$ and $\phi_1$ potentials are such that potential wells are present beneath electrodes 114, 116 and 118 as illustrated in FIG. 13 at a. Control voltage $G_O$ goes high to +3V shortly after time $t_1$ to produce conduction paths beneath gate electrode 120 between the $\phi_1$ electrodes such as 118 and the column conductor diffusions such as 122. Accordingly, electrons flow from the diffusions 110 to the columns, that is, for example, from diffusion 110a to column P.

During the reset interval, SD goes high to +3V so that the diffusions 110 operate as drains. However, the column conductors discharge through a different path than that of "restore". Referring to a single column P by way of example, the charge path for restoring a column is from diffusion 110a via the various depletion regions already discussed to column P. The discharge path for setting column P to a reference potential is via the depletion regions beneath gate electrode 120, $\phi_1$ electrode 118, $\phi_2'$ electrode 124, $\phi_2$ electrode 126 and gate electrode 112 to diffusion 110b. As is most clear from FIG. 13b, the reference potential to which the columns are set is $\phi_2' - V_{TH}$, as the shallowest depletion region is beneath the $\phi_2'$ electrode 124. The value of $\phi_2'$ is 2V.

Just prior to time $t_3$, $G_D$ returns to 0 as does SD. The read interval starts at time $t_3$ when the row conductor for the row being read changes from a positive value +3V to a less positive value +V. As in the previous systems, this causes a negative voltage to be induced in the columns by the photoelectrons transferred to beneath plates $P_N$ of the CIDs and the readout transistors are turned on in response thereto. This is illustrated at c in FIG. 13. Electrons flow from a column such as P via the conduction path beneath electrode 120 and then beneath $\phi_1$ electrode 118 and $\phi_2'$ electrode 124 to the potential well beneath $\phi_2$ electrode 126. As in the previous systems, the same transistor is involved during reset as in readout and therefore the same threshold voltage is involved. Accordingly, the effect of the threshold voltage cancels. It is clear from FIGS. 13b and 13c that this transistor is the one for which the $\phi_2'$ element 124 is the gate electrode.

The remainder of the operation is believed to be self-evident from the figures.

As showld be clear from the explanation above, aside from using substantially only a single source drain diffusion per stage, the circuit of FIG. 11 differs from that of, for example, FIG. 3 in that the source-follower discharge transistor is actually within the output register in the FIG. 11 system. An advantage of this arrangement is that the width of the discharge transistor and therefore its transconductance can be increased without increasing the center-to-center spacing of the output register. In other words, the width of the conduction channel can be increased simply by making the CCD electrodes longer—extending them in the column direction, and this does not increase the spacing required from one column of the array to the next. In the system of FIG. 11, the gate electrode 120 driven by control voltage $G_O$ does not serve as the gate electrode of the source follower discharge transistor, that is, it is not what determines the value of $V_{TH}$ which is of concern in the resetting of the columns to a reference potential. It therefore can be turned on hard during readout so that its narrow width does not limit its discharge capability as might be the case in the system of FIG. 3.

Figure 14:
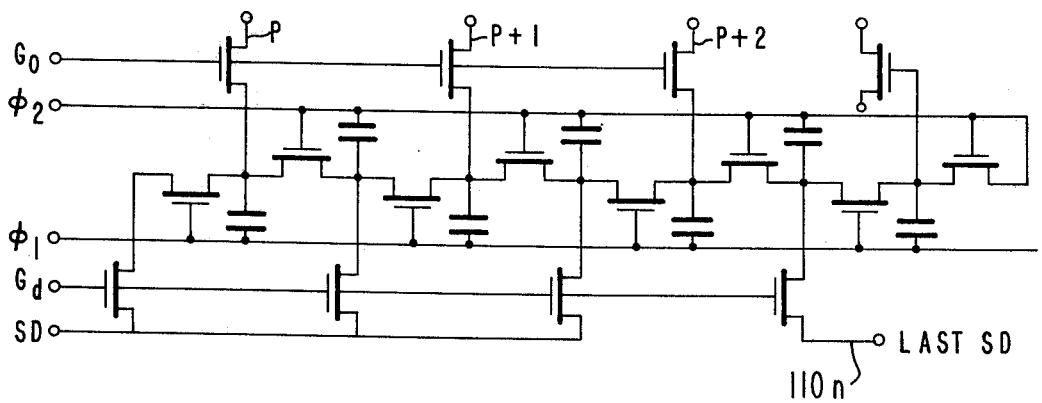
FIG. 14 is a schematic drawing of an alternative form of output register for the system of FIG. 11.

As in the previous systems, the CCD output register of FIG. 11 can be replaced with a bucket brigade output register. Such a register is shown in FIG. 14. The SD taps are at the intermediate stages between the signal input stages to provide a discharge path through the register. In practice, it is also easier to lay out the integrated bucket brigade register in this manner. A much larger current flows in and out of the SD tap then flows through the output register. This current serves partially to provide "a fat-zero" background current in the case of the CCD register of FIG. 11 which improves the effectiveness of the discharge transistor and partly for charging and discharging the high capacitance columns during the "restore" and "reset" intervals. As the SD current for each column is introduced a half stage ahead of the column and withdrawn a half stage after the column, one more SD tap is required than there are columns. This is shown at $110n$ in both FIGS. 11 and 14. In the circuits illustrated by way of example, the last SD tap is brought out separately for current monitoring purposes; however, it can instead be connected to the remaining SD taps.

Figure 15:
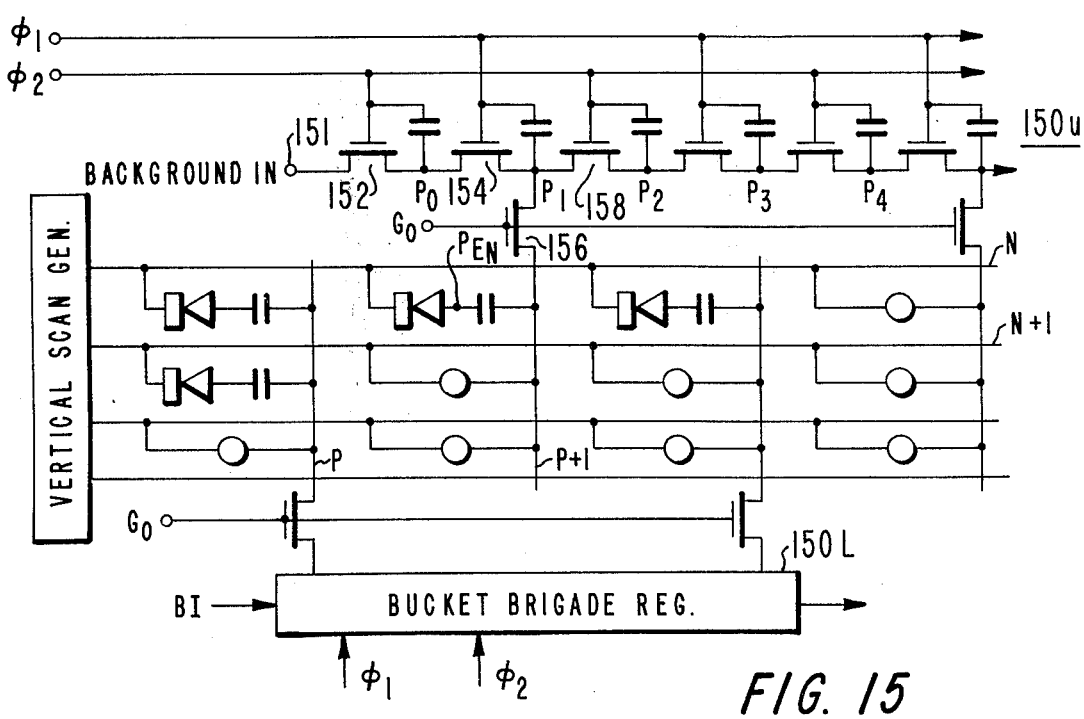
FIG. 15 is a schematic showing of another embodiment of the invention.
Figure 16:
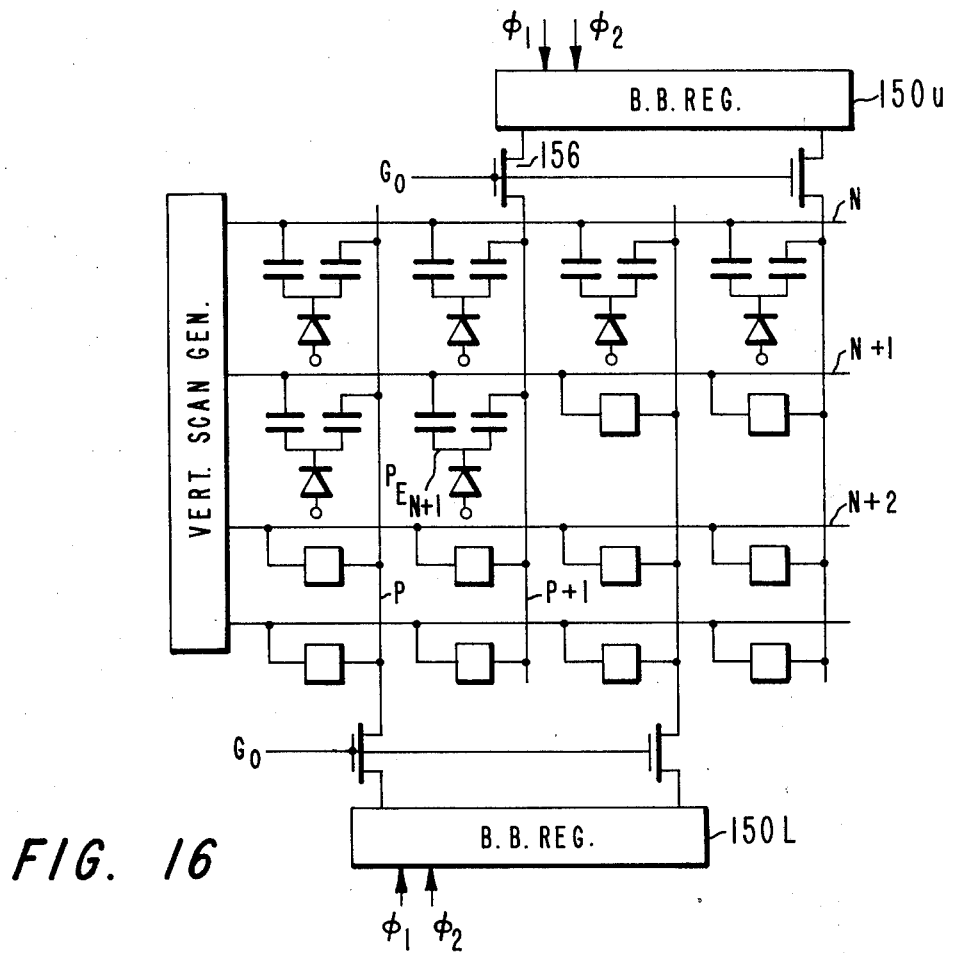
FIG. 16 is a schematic showing of another embodiment of the invention.

FIGS. 15 and 16 illustrate embodiments of the invention in which no source drain (SD) taps are required for the restore or reset operations. Instead, the charge needed for placing excess electrons on the columns is introduced via the charge transfer registers, illustrated as N-channel transistor bucket brigade registers 150U and 150L in these figures. The registers require two stages per column and the charge needed to replenish the columns during "restore" and which later are withdrawn from the columns during "reset" is interleaved with the signals read from the columns during "read".

The charge injection devices of the arrays of FIGS. 15 and 16 are different than those of the previous figures. The single capacitor devices of FIG. 15 and the double capacitor devices of FIG. 16 are of the type shown in my U.S. Pat. No. 3,521,244 issued July 21, 1970. As discussed in this patent, in the operation of these devices, injection occurs simultaneously with readout. The operation of the systems of FIGS. 15 and 16 is illustrated in the single FIG. 18. For the sake of simplifying the drawing, FIG. 18 is drawn as if the single capacitor devices of FIG. 15 were in row N of an array and the double capacitor device 16 were in row N+1 of the same array. The single capacitor device of FIG. 15 operates by collection of photoemitter holes at the surface of the diffused P-type photodiode, while the double-capacitor device of FIG. 16 operates by collection of photoemitted electrons at the surface of the diffused N-type photodiode. In each case the photocharge is discharged during the readout operation by injection of the carriers into the substrate.

In the discussion of the operation which follows, first FIG. 15 will be dealt with. "Background in" at terminal 151 refers to the charge signals (electrons) supplied at the input to bucket brigade register 150U. These charge signals are made available at spaced times such that they become stored in each alternate stage. The bucket brigade register is one of the single clock type, that is, $\phi_1$ remains at a constant level +V and $\phi_2$ swings between levels 0 and +2V. At time $t_1$ which is the beginning of the restore period, background charge signal is present at node $P_0$. When $\phi_2$ goes negative turning transistor 152 off, a background charge signal transfers via the conduction path of transistor 154 of node $P_1$. Shortly thereafter, $G_O$ goes high turning on transistor 156 and these electrons flow through this transistor to column $P + 1$. Here as in the previous discussion only one of the columns will be referred to, it being understood that the same thing is occurring at the remaining columns and the same holds for the explanation of the charge injection elements.

At time $t_2$, $\phi_2$ goes high turning on transistor 158 of the bucket brigade register. $G_O$ still is high. Accordingly, the excess electrons in column $P + 1$ flow through transistor 51 and transistor 158 to node $P_2$. This is the reset operation, column $P + 1$ being reset to the potential $\phi_2 - V_{TH}$ of transistor 158. When the column reaches this potential, transistor 158 stops conducting. Transistor 156 remains turned on hard and therefore remains in a conducting condition; however, when transistor 158 is turned off, current flow through 156 ceases. As will be shown shortly, readout occurs at a later time through transistor 158 cancelling the effect of $V_{TH}$ variation in 158.

During the readout interval, more precisely, during a small portion of the readout interval, the row being read, N in this example, is pulsed relatively negatively. This causes an information signal (a negative swing) proportional to the photo-excited holes stored at $P_{EN}$ to be induced in column $P + 1$ and at the same time the holes are injected back into the substrate. (The removal of holes bound under the column capacitor has the same effect in charging the column bus negative as did the acquisition of electrons by this capacitor in the previous examples). $\phi_2$ is at ground level at this point and node $P_2$ is not yet available for the reception of signal. At this time the excess electrons stored at $P_2$ are being shifted to the stage ahead. At $t_4$ the $\phi_2$ clock goes positive and now node $P_2$ is ready to receive signal. The information signal present at column P+1 causes transistor 158 to turn on and current flows through 156 (which is hard on) transistor and through transistor 158 to node $P_2$. This is manifested at this node by an increase in electrons, that is, by this node becoming more negative.

The remainder of the operation is believed to be clear from FIG. 18. Each time a row is read out, the charge is stored in the bucket brigade register. This charge comprises the information signal and is stored in alternate stages. The unused background signal is stored in the remaining alternate stages interleaved with the information signals. Therefore, during the serial readout of each bucket brigade output register, the contents of the alternate stages containing excess charge signals must be separated from the interleaved signals. This readily can be accomplished by an appropriate gating structure for shunting these undesired signals to a drain diffusion. The remaining signals in the two registers are combined in serial fashion to reconstitute the row video information, Alternatively, the modulated background signal can be inverted, and added to the delayed direct signal from the preceding row to obtain a signal-to-noise improvement in the output signal. This is possible because the modulated background signal obtained when the columns are reset for a given line is the inverse of the direct signal obtained when the preceding line was scanned.

The operation of the embodiment of FIG. 16 is quite analogous to that of FIG. 15 except that the video signal polarity obtained from the columns of a double-capacitor photodiode array is opposite that obtained from a single capacitor array. That is, in the brightest areas, where a maximum amount of charge injection into the substrate occurs the negative charge induced in the columns of the double capacitor structure will be a minimum, while it would be a maximum for the single capacitor structure. Note that the photodiodes are of opposite polarity for the two cases so that a negative pulse could be used on the row bus for injection in each case. Since a negative pulse is induced in the columns in both systems during the read interval the overall readout operation is the same except for the above-mentioned difference in signal polarity. This should be clear from FIG. 18.

While the embodiments of FIGS. 15 and 16 are shown to have bucket brigade output registers, it is of course to be understood that CCD registers may be employed instead. A suitable such register is illustrated in FIG. 17.

Figure 17:
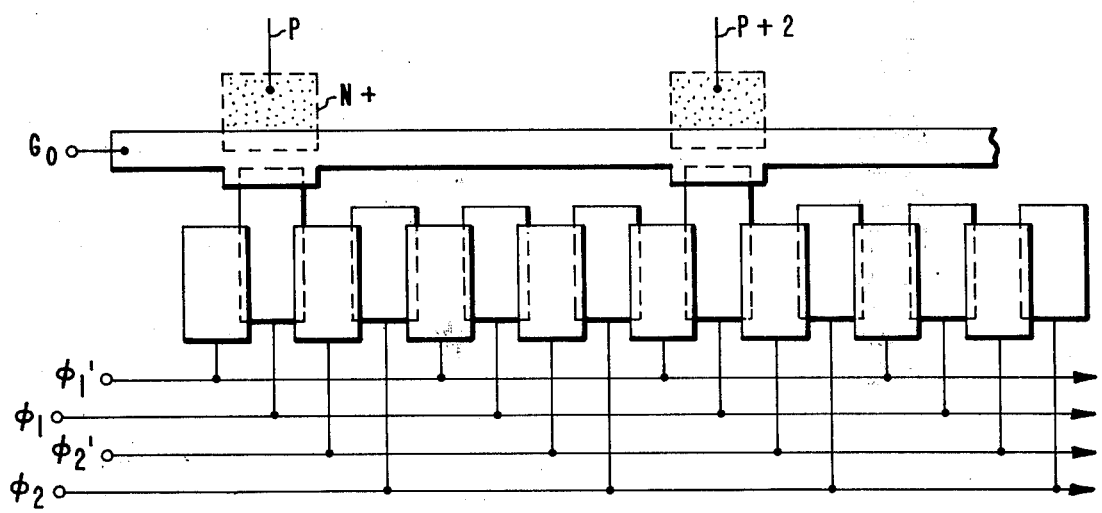
FIG. 17 is a schematic showing of an alternative form of output register which may be used in the systems of FIGS. 15 and 16.

It is clear that the same method of readout illustrated in FIGS. 15, 16 and 17 could be carried out if the single output register tapped at every other stage wires replaced by a double-channel output register having only half as many stages in each portion. The two channels would be coupled at each stage so that the excess reset charge could be transferred across the first channel to the second, while the direct signal was then retained in the first channel. The two signals would then be transported out in parallel with only half as many transfers, and no high speed sampling would be required to separate the signals. This type of double-channel output might be preferred in application requiring both the direct and reset signals for subsequent signal processing. Such multiple channel registers are illustrated in the above-identified Kosonocky application.

The readout system illustrated in FIGS. 15 — 17 can also be used with the CID sensor structure illustrated in FIGS. 1 and 2 provided adequate charge can be introduced to the high capacitance columns to swing their voltage the required amount. If the column voltage swing were too small, the photocharge collected at each element would be similarly limited. However, the voltage swing in the columns could be maintained by connecting each column to a common bus through a transistor such as 44 - 46 - 54 in FIG. 3, while still transporting the excess reset charge through alternate stages of the output register.

What is claimed is:
1. The combination of:
an array of charge injection devices arranged in columns and rows, said array comprising row conductors, column conductors, and charge injection devices, each such device capacitively coupled both to a row conductor and to a column conductor;
means prior to each read interval for resetting the column conductors of said array to a reference potential;
charge transfer register means; and
means responsive to the changes in potential capacitively coupled to said column conductors of said array in response to the application of a read voltage to a row conductor of said array for supplying charge signals, in parallel, to said charge transfer register means indicative of the information signals stored in said row of said array.

2. The combination as set forth in claim 1 wherein said charge transfer register means comprises a charge-coupled device register.

3. The combination as set forth in claim 1 wherein said charge transfer register means comprises a bucket-brigade register.

4. The combination of:
an array of charge injection devices arranged in columns and rows, said array comprising row conductors, column conductors, and charge injection devices, each such device coupled to a row conductor and a column conductor;
means prior to each read interval for resetting the column conductors of said array to a reference potential;
charge transfer register means;
means responsive to the changes in potential at said column conductors of said array in response to the application of a read voltage to a row conductor of said array for supplying charge signals, in parallel, to said charge transfer register means indicative of the information signals stored in said row of said array;
said means for resetting comprising a plurality of transistors, one per column, each transistor including a conduction path connected at one end to a column conductor, and a gate electrode, means during one time interval for placing said gate electrodes at a potential to turn said transistors on, and means during said one time interval for placing the other end of said conduction paths at a potential such that it acts as a source of charge carriers, whereby charge carriers flow through said transistors to said columns, and means during a following time interval, while said transistors are still on, for changing the potential at said other end of said conduction paths to a value such that it operates as a drain for said charge carriers, whereby change carriers flow from said column conductors through said conduction paths until each column conductor assumes a potential $V_G-V_{TH}$, where $V_G$ is the voltage of said control electrode and $V_{TH}$ is the threshold voltage of the transistor for that column conductor; and
said means responsive to said change in potential including the same transistors employed for resetting said column conductors, a current flowing through the conduction path of each transistor in response to a signal potential induced on the column conductor to which it is connected in a sense to turn on said transistor.

5. The combination as set forth in claim 4, further including a semiconductor substrate and in which each transistor comprises a portion of said semiconductor substrate, a region in the substrate of opposite conductivity than the substrate individual to a column and serving as one end of the conduction path of said transistor, said region connected to said column conductor, control electrode means spaced from said substrate, coupled to said region and common to all of said transistors, and a depletion region in said substrate coupled to said control electrode and individual to that transistor, said depletion region serving as said other end of said conduction path.

6. The combination as set in claim 5 wherein said charge transfer register comprises a charge-coupled device register, said register comprising a plurality of electrodes and means for applying multiple phase voltages to said electrodes, each depletion region comprising a region of the substrate beneath a different one of said electrodes.

7. The combination as set forth in claim 6, wherein said charge-coupled device register comprises a plurality of stages, each stage comprising N electrodes, where N is an integer greater than 1, each depletion region forming an end of a conduction path of a transistor being in a different register stage.

8. The combination as set forth in claim 4 wherein each transistor comprises a semiconductor substrate, a first region of opposite conductivity than the substrate individual to a column and serving as one end of the conduction path of said transistor, said region connected to a column conductor, a control electrode spaced from said substrate, coupled to said region and common to all of said transistors, and a second region in the substrate of opposite conductivity than the substrate individual to said transistor, said second region serving as the other end of said conduction path.

9. The combination as set forth in claim 8 wherein said second region comprises an electrically floating region, and further including during said one time interval, means for supplying charge carriers to said second region for permitting it to operate as a source, and means during said following time interval, for withdrawing carriers from said second region for permitting it to operate as a drain.

10. The combination as set forth in claim 9, wherein said charge transfer register comprises a charge-coupled device register having a plurality of electrodes, N per stage, where N is an integer greater than 1, and gate means common to all of said transistors for transferring the charge signal from each transistor to a different charge-coupled device register stage.

11. The combination as set forth in claim 9 wherein said means for supplying charge carriers and said means for withdrawing charge carriers includes, adjacent to each second region, a third region in the substrate of opposite conductivity than the substrate, a conductor connected to all of said third regions, means coupled to said conductor for varying its potential from a value such that said third regions act as sources of charge carriers to a value such that said third regions act as drains for charge carriers, and control electrode means common to all second and adjacent third regions coupled to the portions of the substrate between each pair of second and adjacent third regions for controlling the flow of charge carriers therebetween.

12. The combination of:
an array of charge injection devices arranged in columns and rows, said array comprising row conductors, column conductors, and charge injection devices, each such device coupled to a row conductor and a column conductor;
means prior to each read interval for resetting the column conductors of said array to a reference potential;
charge transfer register means;
means responsive to the changes in potential at said column conductors of said array in response to the application of a read voltage to a row conductor to said array for supplying charge signals, in parallel, to said charge transfer register means indicative of the information signals stored in said row of said array; and
said array including a semiconductor substrate common to all charge injection devices, and each charge injection device comprising first and second conductors, said first conductor connected to a column conductor and said second conductor connected to a row conductor, each of said first and second conductors being insulated from and electrically coupled to said substrate and said first and second conductors being spaced sufficiently close to one another to permit the transfer of charge carriers from the region of the semiconductor substrate beneath one to the region of the semiconductor substrate beneath the other, and vice versa.

13. The combination as set forth in claim 12 wherein each charge injection device further includes, in the region of the substrate between said first and second conductors, a diffusion of opposite conductivity type than the substrate for facilitating the transfer of charge.

14. The combination as set forth in claim 5, in which said means during one time interval for placing the other end of said conduction paths at a potential such that it acts as a source of charge carriers comprises, for each transistor, a second region in said substrate of opposite conductivity than the substrate adjacent to the depletion region of said transistor, control means connected to all of said second regions for varying their potential, and second control electrode means common to all of said transistors over the portion of the substrate between each depletion region and the second region adjacent thereto for controlling the flow of charge carriers therebetween.

15. The combination as set forth in claim 14 wherein said means for changing the potential at said other end of said conduction paths to a value such that it operates as a drain for charge carriers comprises said control means for supplying a potential to said second regions for causing them to operate as drains and said second control electrode means for producing a conduction path in the substrate for permitting said second regions to withdraw charge carriers from said depletion regions.

16. The combination of:
an array of charge injection devices arranged in columns and rows, said array comprising row conductors, column conductors, and charge injection devices, each such device coupled to a row conductor and a column conductor;
means prior to each read interval for resetting the column conductors of said array to a reference potential;
charge transfer register means;
means responsive to the changes in potential at said column conductors of said array in response to the application of a read voltage to a row conductor of said array for supplying charge signals, in parallel, to said charge transfer register means indicative of the information signals stored in said row of said array;
said means for resetting comprising means operative during a first time interval for placing charge carriers on all column conductors, a plurality of transistors, one per column, each transistor including a conduction path, means for coupling one end of said path to a column conductor, and gate electrode means, means operative during a second time interval following said first time interval for placing all of said gate electrode means at a potential to turn said transistors on, and means operative during said second time interval for placing the other end of said conduction paths at a potential such that it operates as a drain for said charge carriers, whereby charge carriers placed on said column conductors during said first time interval flow from said column conductors through said conduction paths until each column conductor assumes a potential $V_G-V_{TH}$, where $V_G$ is the voltage of said control electrode and $V_{TH}$ is the threshold voltage of the transistor for that column conductor; and said means responsive to said change in potential including the same transistors employed for resetting said column conductors, a current flowing through the conduction path of each transistor in response to a signal potential induced on the column conductor to which it is coupled of a sense to turn on said transistor.

17. The combination as set forth in claim 16, wherein said means for placing charge carriers on all column conductors comprises a semiconductor substrate, and for each column conductor, a region in said substrate of opposite conductivity than the substrate, means for placing that region at a potential to operate as a source for said charge carriers, and means for causing said charge carriers to flow from said region to said column conductor.

18. The combination as set forth in claim 17, wherein said means for placing the other end of said conduction paths at a potential such that it operates as a drain for said charge carriers comprises, for each column conductor, the region of the substrate of opposite conductivity than the substrate for the immediately following column conductor, means for placing that region at a potential such that it operates as a drain, and means for causing a conduction path to form in said substrate between that region and said other end of the conduction path of the transistor for that column conductor.

19. The combination as set forth in claim 18, wherein said other end of said conduction paths of said transistors comprises, in each case, a depletion region in the substrate.

20. The combination as set forth in claim 19 wherein said charge transfer register means comprises a charge-coupled device register means, said charge coupled device register mans comprising said substrate, a plurality of electrodes over said substrate and means for applying voltages to said electrodes for creating depletion regions in said substrate, and wherein said other end of said conduction path of each transistor comprises, in each case, a different one of said depletion regions in said register means.

21. The combination as set forth in claim 18 wherein said other end of said conduction paths of said transistors comprise, in each case, a diffusion in the substrate of opposite conductivity than the substrate.

22. The combination as set forth in claim 21 wherein said charge transfer means comprises bucket brigade register means, said bucket brigade register means comprising a plurality of transistors, each having gate, drain and source electrodes, each transistor connected at its drain electrode to the source electrode of the following transistor and including also capacitance between the gate and drain electrodes of each transistor, said diffusion in the substrate comprising in each case, the connection from the drain electrode of one transistor to the source electrode of the following transistor in said bucket brigade register means.

23. The combination as set forth in claim 16 wherein said means for resetting comprises, said charge transfer register means, means for supplying charge signal to alternate stages of said register means, means for shifting said charge signals to alternate stages of said register means adjacent to the respective column conductors of said array, and means for transferring the charge signal from said alternate stages to the respective column conductors of said array.

24. The combination as set forth in claim 23, wherein said means operative during said second time interval for placing the other end of said conduction paths at a potential such that it operates as a drain for said charge carriers comprises means for shifting the contents of said charge transfer register means to a position such that each column connects through its transistor to a point in said register means which is at a potential to operate as a drain for charge carriers.

25. The combination as set forth in claim 16 wherein said array of charge injection devices comprises a semiconductor substrate and wherein each charge injection device includes a diffusion of opposite conductivity than the substrate, capacitive means comprising conductor means adjacent to said diffusion, each said capacitive means coupled to a column conductor and a row conductor for accumulating charge carriers in response to photon excitation when said row conductor is at one potential and for both injecting said carriers into the substrate and inducing a voltage on said column conductor when said row conductor is switched to a second potential.

26. In combination,
an array of charge injection devices comprising a semiconductor substrate, column conductors, row conductors, and charge injection devices, each device coupled to a row conductor, a column conductor and said substrate;
means after a read operation for placing charge carriers on each column conductor;
means during a following time interval for withdrawing charge carriers from each column conductor for resetting said column conductors to a potential $V_R = V_G - V_{TH}$, said meaans including, at each column a transistor having source, gate and drain electrodes operated in the source follower mode, that is, coupled at its source electrode to a column conductor, and means applying a potential $V_G$ to said gate electrode, $V_{TH}$ being the threshold voltage of said transistor;
a charge transfer register having a plurality of signal input nodes, each for a different column conductor, each node serving as a signal receiving point at the drain electrode of one of said transistors;
means or placing row conductors of said array at a potential for permitting charge signals to be accumulated by said charge injection devices; and
means for reading from one of said rows any charge signals which have been accumulated by the charge injection devices of that row comprising means for changing the voltage applied to said row conductor in a sense to induce voltages in said column conductors in proportion to the number of charge carriers, respectively, accumulated by the respective charge injection devices of said row.

* * * * *

UNITED STATES PATENT OFFICE
CERTIFICATE OF CORRECTION

Page 1 of 2

PATENT NO. : 4,016,550
DATED : April 5, 1977
INVENTOR(S) : Paul Kessler Weimer

It is certified that error appears in the above-identified patent and that said Letters Patent are hereby corrected as shown below:

In the Abstract, line 2, "devides" should be --devices--.

Column 2, line 56, "region," to read -- region. --.

Column 3, line 35, delete "invention".

Column 3, line 40, "electrons" should be --electrode--.

Column 3, line 48, "device" should be --voltage--.

Column 4, line 47, "$t_{1a}$." should be --$t_{1a}$,--.

Column 6, line 3, "included" should be --induced--.

Column 6, line 7, "a" to read -- at --.

Column 6, line 15, after "transistor" insert a period.

Column 6, line 68, "separator" should be --separate--.

Column 7, line 56, "betweem" should be --between--.

Column 8, line 45, "The" should be --the--.

Column 8, line 51, "period." should be --period --.

Column 9, line 8, after "goes" insert --from--.

Column 9, line 32, after "FIG. 7" insert a period.

Column 10, line 57, "showld" should be --should--.

Column 13, line 39, "application" should be --applications--.

UNITED STATES PATENT OFFICE
CERTIFICATE OF CORRECTION

Page 2 of 2

PATENT NO. : 4,016,550
DATED : April 5, 1977
INVENTOR(S) : Paul Kessler Weimer

It is certified that error appears in the above-identified patent and that said Letters Patent are hereby corrected as shown below:

Column 14, line 42, "change" should be --charge--.

Column 17, line 47, "mans" should be --means--.

Column 17, line 59, after "transfer" insert --register--.

Column 18, line 45, "meaans" should be --means--.

Column 18, line 56, "or" should be --for--.

Signed and Sealed this twelfth Day of July 1977

[SEAL]

Attest:

RUTH C. MASON
Attesting Officer

C. MARSHALL DANN
Commissioner of Patents and Trademarks